(12) United States Patent
Lee

(10) Patent No.: US 9,826,642 B1
(45) Date of Patent: Nov. 21, 2017

(54) CIRCUIT BOARD STRUCTURE AND MANUFACTURING METHOD THEREOF

(71) Applicant: BOARDTEK ELECTRONICS CORPORATION, Taoyuan (TW)

(72) Inventor: Chien-Cheng Lee, Taoyuan (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 0 days.

(21) Appl. No.: 15/393,781

(22) Filed: Dec. 29, 2016

(30) Foreign Application Priority Data

Oct. 17, 2016 (TW) .............................. 105133424 A

(51) Int. Cl.
| | |
|---|---|
| *H05K 1/16* | (2006.01) |
| *H05K 1/18* | (2006.01) |
| *H05K 1/11* | (2006.01) |
| *H01C 17/065* | (2006.01) |
| *H01C 7/00* | (2006.01) |
| *H01C 1/142* | (2006.01) |
| *H05K 3/32* | (2006.01) |
| *H05K 3/46* | (2006.01) |

(52) U.S. Cl.
CPC ............ *H05K 1/185* (2013.01); *H01C 1/142* (2013.01); *H01C 7/003* (2013.01); *H01C 17/06513* (2013.01); *H05K 1/111* (2013.01); *H05K 3/32* (2013.01); *H05K 3/4673* (2013.01); *H05K 2201/10022* (2013.01)

(58) Field of Classification Search
CPC ............ H05K 1/16; H05K 1/18; H05K 1/231; H01G 4/12; H01G 4/30; H01G 4/40
USPC ..... 174/260; 361/306.1, 306.3, 321.2, 275.3, 361/763, 782; 257/700, E23.062
See application file for complete search history.

(56) References Cited

U.S. PATENT DOCUMENTS

| | | | | |
|---|---|---|---|---|
| 5,635,761 A * | 6/1997 | Cao | ..................... | H01L 23/5383 257/684 |
| 5,823,680 A * | 10/1998 | Kato | ..................... | G01K 7/183 338/17 |
| 5,889,462 A * | 3/1999 | Rana | ..................... | H01C 1/16 338/254 |
| 6,542,352 B1 * | 4/2003 | Devoe | ..................... | H01G 4/228 361/306.1 |
| 2007/0076392 A1 * | 4/2007 | Urashima | ................ | H01G 2/06 361/763 |
| 2015/0116892 A1 * | 4/2015 | Park | ..................... | H01G 4/40 361/275.3 |
| 2015/0131194 A1 * | 5/2015 | Park | ..................... | H01G 4/40 361/275.3 |

(Continued)

*Primary Examiner* — Xiaoliang Chen
(74) *Attorney, Agent, or Firm* — Li & Cai Intellectual Property (USA) Office

(57) ABSTRACT

A circuit board structure includes a multi-layer board and a ceramic resistor embedded in the multi-layer board. The ceramic resistor includes a ceramic sheet, a plurality of connecting pads spacedly arranged on the ceramic sheet, and a plurality of resistance layers arranged on the ceramic sheet. At least one of the resistance layers is arranged between and electrically connected to any two of the connecting pads for providing a resistance value. The number of the resistance values provided by the ceramic resistor is more than the number of the resistance layers. The multi-layer board has a plurality of contacts arranged apart from each other, and the contacts are respectively and electrically connected to the connecting pads.

6 Claims, 4 Drawing Sheets

(56) References Cited

U.S. PATENT DOCUMENTS

2015/0131195 A1* 5/2015 Park .................. H01G 2/14
 361/275.3
2015/0131196 A1* 5/2015 Park .................. H01G 4/40
 361/275.3

* cited by examiner

CIRCUIT BOARD STRUCTURE AND MANUFACTURING METHOD THEREOF

BACKGROUND OF THE INVENTION

1. Field of the Invention

The instant invention relates to a circuit board; in particular, to a circuit board structure with a ceramic resistor embedded therein and a manufacturing method thereof.

2. Description of Related Art

A conventional circuit board structure is formed by embedding a resistor in a multi-layer board and soldering the resistor to an inner soldering pad of the multi-layer board. Thus, when an outer soldering pad of the multi-layer board is in a soldering process, the inner soldering pad is easily melted or softened to cause a connection problem between the inner soldering pad and the resistor, such that a resistance value provided from the conventional circuit board structure is not precise.

Moreover, which embedded resistor of the conventional circuit board structure to use is determined according to a required and specific resistance value, so the conventional circuit board structure cannot achieve different resistance values. In other words, in order to achieve different resistance values, the conventional circuit board structure needs to have a plurality of resistors embedded in the multi-layer board, such that the volume of the conventional circuit board structure is increased, and connection problems between the inner soldering pads and the resistors occur more easily when the outer soldering pad of the multi-layer board is in a soldering process. Accordingly, each resistance value provided from the conventional circuit board structure using these resistors may also not be precise.

SUMMARY OF THE INVENTION

The instant disclosure provides a circuit board structure and a manufacturing method thereof for effectively solving the problem caused by conventional circuit board structures.

The instant disclosure provides a manufacturing method of a circuit board structure, comprising: forming a plurality of first connecting pads and a plurality of first resistance layers on a first surface of a ceramic sheet to construct a ceramic resistor, wherein any two of the first connecting pads are electrically connected to at least one of the first resistance layers to provide a resistance value, the ceramic resistor is configured to provide a plurality of resistance values by using the first connecting pads and the first resistance layers, and the number of the resistance values is more the number of the first resistance layers; disposing the ceramic resistor on a substrate unit; forming an insulating material on the substrate to encapsulate the ceramic resistor; and forming a first conductive layer on one of the substrate unit and the insulating material to construct a circuit board structure, wherein the first conductive layer includes a plurality of first contacts respectively and electrically connected to the first connecting pads, and the first contacts are arranged apart from each other.

The instant disclosure also provides a circuit board structure, comprising: a ceramic resistor including: a ceramic sheet having a first surface and an opposite second surface; a plurality of first connecting pads spacedly formed on the first surface of the ceramic sheet; and a plurality of first resistance layers formed on the first surface of the ceramic sheet, wherein each of the first resistance layers connects at least two of the first connecting pads, and any two of the first connecting pads are electrically connected to at least one of the first resistance layers to provide a resistance value, wherein the ceramic resistor is configured to provide a plurality of resistance values by using the first connecting pads and the first resistance layers, and the number of the resistance values is more the number of the first resistance layers; and a multi-layer board having a first conductive layer, wherein the ceramic resistor is embedded in the multi-layer board, and the first conductive layer includes a plurality of first contacts respectively and electrically connected to the first connecting pads, and the first contacts are arranged apart from each other.

In summary, the first connecting pads of the ceramic resistor in the instant disclosure are not provided for soldering, so each first connecting pad can be made of a material having a high melting point, which is more than a melting point of a soldering pad. Thus, when the first contacts are in a soldering process, the first connecting pads of the ceramic resistor are not influenced, thus providing precise resistance values, and the circuit board structure can provide different precise resistance values by using the first contacts.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

Please refer to FIGS. 1 through 9, which show an embodiment of the instant disclosure. References are hereunder made to the detailed descriptions and appended drawings in connection with the instant invention. However, the appended drawings are merely shown for exemplary purposes, rather than being used to restrict the scope of the instant invention.

The instant embodiment discloses a circuit board structure 100 and a manufacturing method thereof, and the circuit board structure 100 provides a plurality of precise resistance values for achieving different resistance value requirements. In order to clearly explain the instant embodiment, the following description first discloses the manufacturing method of the circuit board structure 100, which includes steps S110~S150.

Figure 1:
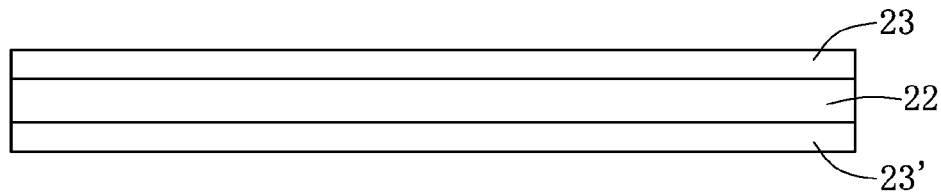
FIG. 1 is a first cross-sectional view showing step S110 of a manufacturing method of the circuit board structure according to the instant disclosure.
Figure 2:
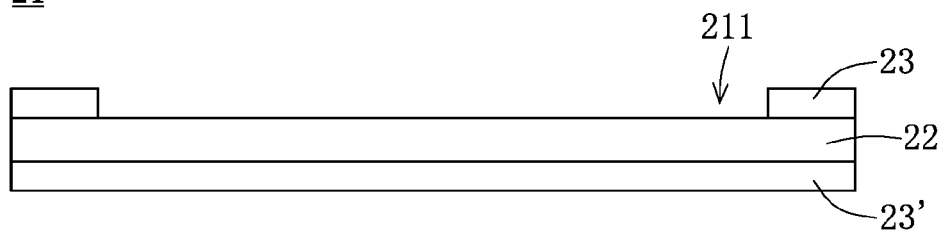
FIG. 2 is a second cross-sectional view showing step S110 of the manufacturing method of the circuit board structure according to the instant disclosure.

Please refer to FIGS. 1 and 2, which show step S110 of the manufacturing method. A substrate unit 21 having a notch 211 is provided. The substrate unit 21 in the instant embodiment includes an insulating layer 22 and two metal layers 23, 23' respectively formed on two opposite surfaces of the insulating layer 22, and the metal layer 23 is formed with the notch 211. Moreover, part of the insulating layer 22 is exposed from the metal layer 23 via the notch 211.

Figure 3:
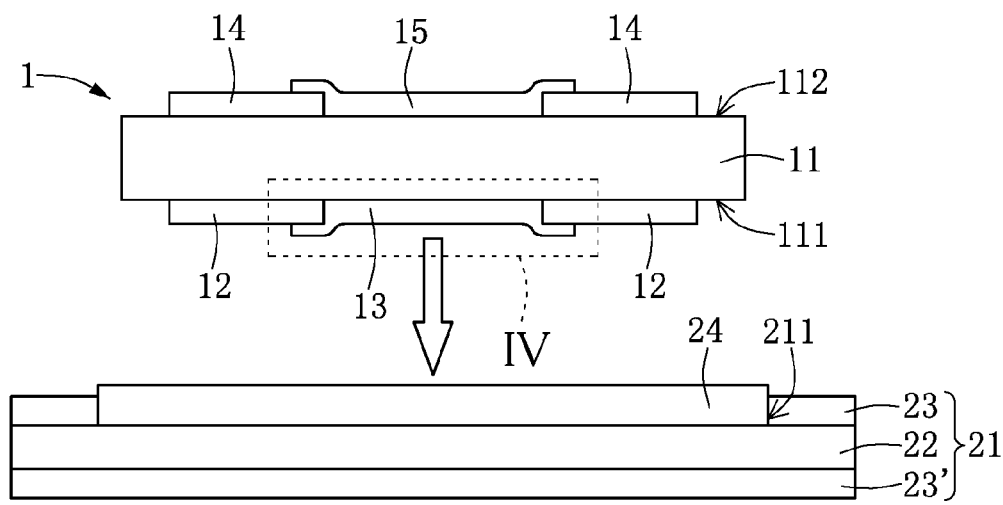
FIG. 3 is a cross-sectional view showing step S120 of the manufacturing method of the circuit board structure according to the instant disclosure.
Figure 4:
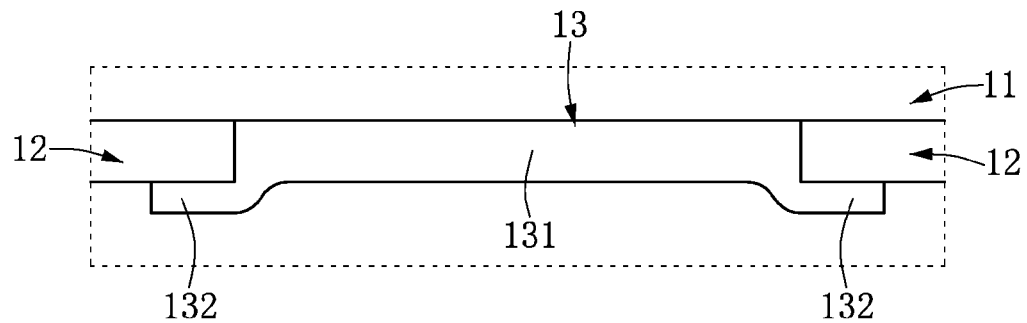
FIG. 4 is an enlarged view showing the cross-section IV of FIG. 3.
Figure 5:
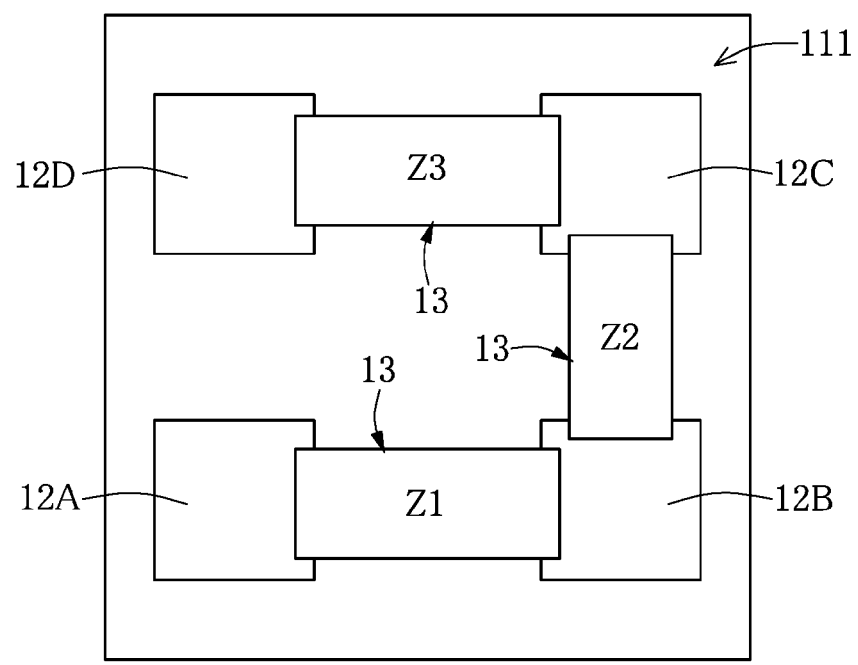
FIG. 5 is a top view showing the ceramic resistor of FIG. 3.

Please refer to FIGS. 3 through 5, which show step S120 of the manufacturing method. A plurality of first connecting pads 12 and a plurality of first resistance layers 13 are formed on a first surface 111 of a ceramic sheet 11, and then the ceramic sheet 11, the first connecting pads 12, and the first resistance layers 13 are sintered to form a ceramic resistor 1. In the instant embodiment, the first connecting pads 12 are first formed on the first surface 111 of the ceramic sheet 11, and then the first resistance layers 13 are formed on the first surface 111 of the ceramic sheet 11 by using a screen printing manner, but the instant disclosure is not limited thereto.

Moreover, any two of the first connecting pads 12 are electrically connected to at least one of the first resistance layers 13 to provide a resistance value. That is to say, any two of the first connecting pads 12 can provide one resistance value, so the ceramic resistor 1 is configured to provide a plurality of resistance values by using the first connecting pads 12 and the first resistance layers 13, and the number of the resistance values is more the number of the first resistance layers 13.

For example, as shown in FIG. 5, the first connecting pads 12 are the four first connecting pads 12A, 12B, 12C, 12D, and the first resistance layers 13 are respectively provided with three resistance values Z1, Z2, Z3, which are different from each other. When one of the first resistance layers 13 and the connected two first connecting pads 12 are used, the ceramic resistor 1 can provide three resistance values Z1, Z2, Z3. When the two first connecting pads 12A, 12C are used, the ceramic resistor 1 can provide a resistance value Z1+Z2. When the two first connecting pads 12B, 12D are used, the ceramic resistor 1 can provide a resistance value Z2+Z3. When the two first connecting pads 12A, 12D are used, the ceramic resistor 1 can provide a resistance value Z1+Z2+Z3. Accordingly, the ceramic resistor 1 can provide six resistance values by using the four first connecting pads 12 and the three first resistance layers 13. In addition, the first resistance layers 13 in the instant embodiment are electrically connected in series for example, but in a non-shown embodiment, the first resistance layers 13 can be electrically connected in parallel or in series and parallel, thereby providing more resistance values.

Furthermore, after the first connecting pads 12 and the first resistance layers 13 are formed on the first surface 111, a plurality of second connecting pads 14 and a plurality of second resistance layers 15 can be formed on a second surface 112 of the ceramic sheet 11, and then the ceramic sheet 11, the first connecting pads 12, the first resistance layers 13, the second connecting pads 14, and the second resistance layers 15 are sintered to form the ceramic resistor 1. In the instant embodiment, the second resistance layers 15 are formed on the second surface 112 of the ceramic sheet 11 by using a screen printing manner after the second connecting pads 14 are formed on the second surface 112 of the ceramic sheet 11, but the instant disclosure is not limited thereto.

Moreover, any two of the second connecting pads 14 are electrically connected to at least one of the second resistance layers 15 to provide a resistance value. That is to say, any two of the second connecting pads 14 can provide one resistance value, so the ceramic resistor 1 is configured to provide a plurality of resistance values by using the first connecting pads 12, the first resistance layers 13, the second connecting pads 14, and the second resistance layers 15, and the number of the resistance values is more the number of the first and second resistance layers 13, 15.

In addition, the property of the second connecting pads 14 and the second resistance layers 15 in the instant embodiment is approximately identical to that of the first connecting pads 12 and the first resistance layers 13. The layout of the second connecting pads 14 and the second resistance layers 15 can be different from that of the first connecting pads 12 and the first resistance layers 13.

Figure 6:
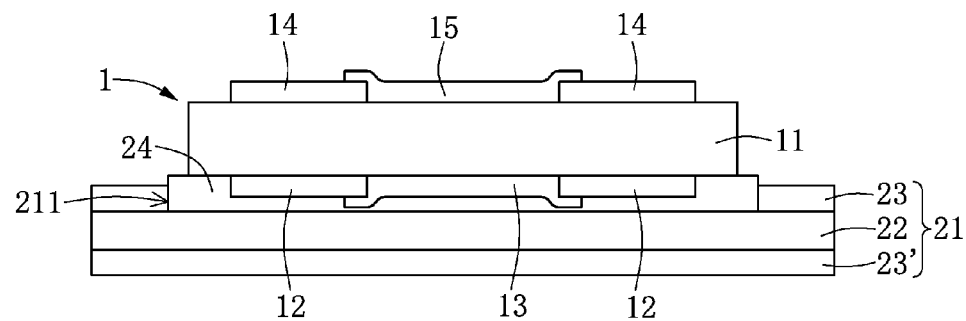
FIG. 6 is a cross-sectional view showing step S130 of the manufacturing method of the circuit board structure according to the instant disclosure.

Please refer to FIG. 6, which shows the step S130 of the manufacturing method. The ceramic resistor 1 is disposed on the substrate unit 21. Specifically, a buffering layer 24 is filled in the notch 211, and the first connecting pads 12 and the first resistance layers 13 are at least partially arranged in the notch 211 of the substrate unit 21 and entirely covered by the buffering layer 24. Thus, the cooperation of the notch 211 of the substrate unit 21 and the buffering layer 24 can firmly position the ceramic resistor 1 on the substrate unit 21, and a damage problem can be avoided when the first connecting pads 12 and the first resistance layers 13 are disposed on the substrate unit 21.

Figure 7:
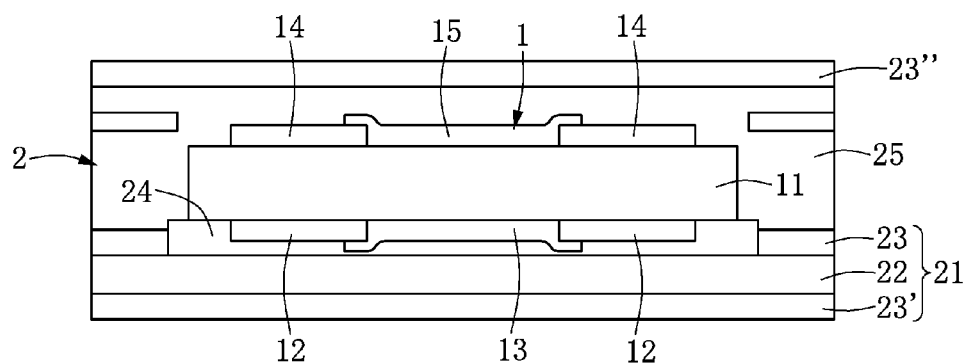
FIG. 7 is a cross-sectional view showing step S140 of the manufacturing method of the circuit board structure according to the instant disclosure.

Please refer to FIG. 7, which shows the step S140 of the manufacturing method. An insulating material 25 is formed on the substrate unit 21 to encapsulate the ceramic resistor 1, and then a metal layer 23" is formed on the insulating material 25. In the process of forming the insulating material 25, a thickness of the insulating material 25 in the instant embodiment is controlled to arrange the ceramic resistor 1 at a center portion of the circuit board structure 100.

In addition, at least one circuit (not labeled) can be formed in the insulating material 25, and the at least one circuit is not electrically connected to ceramic resistor 1.

Figure 8:
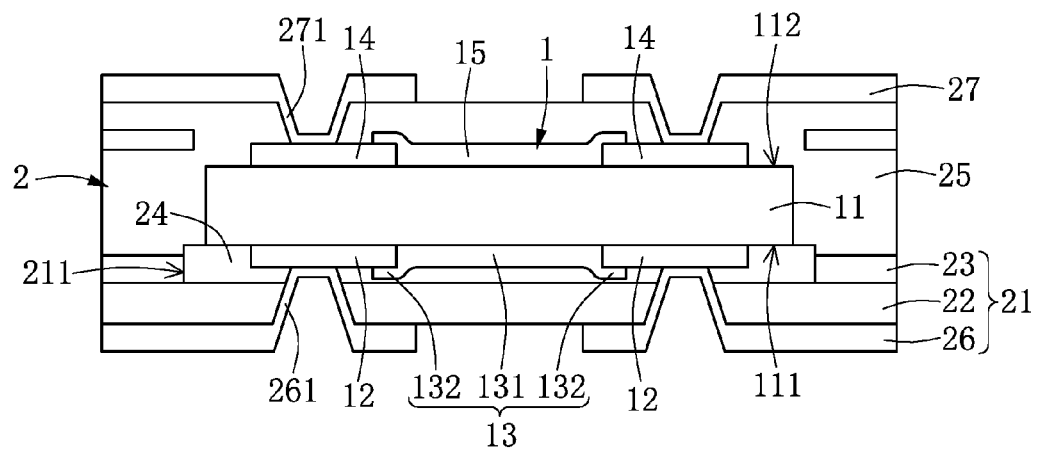
FIG. 8 is a cross-sectional view showing step S150 of the manufacturing method of the circuit board structure according to the instant disclosure.

Please refer to FIG. 8, which shows the step S150 of the manufacturing method. A first conductive layer 26 is formed on the substrate unit 21 to construct a circuit board structure 100. In the instant embodiment, the metal layer 23' (i.e., the bottom metal layer 23' shown in FIG. 7) of the substrate unit 21 is etched and coated to form the first conductive layer 26. Specifically, the first conductive layer 26 includes a plurality of first contacts 261 respectively and electrically connected to the first connecting pads 12, and the first contacts 261 are arranged apart from each other. Moreover, the first contacts 261 of the first conductive layer 26 are formed by passing through the insulating layer 22 and the buffering layer 24 to respectively connect to the first connecting pads 12.

The first connecting pads 12 (and the second connecting pads 14) of the ceramic resistor 1 in the instant embodiment are not provided for soldering, so each first connecting pad 12 (or each second connecting pad 14) can be made of a material (i.e., silver alloy) having a large melting point, which is more than the melting point of the soldering pad. Thus, when the first contacts 261 are in a soldering process, the first connecting pads 12 (and the second connecting pads 14) of the ceramic resistor 1 are not influenced, thus providing precise resistance values, and the circuit board structure 100 can provide different precise resistance values by using the first contacts 261 (and the second connecting pads 14).

Moreover, the metal layer 23" arranged adjacent to the second connecting pads 14 and the second resistance layers 15 can be etched and plated to form a second conductive layer 27. Specifically, the second conductive layer 27 includes a plurality of second contacts 271 respectively and electrically connected to the second connecting pads 14, and the second contacts 271 are arranged apart from each other.

In a non-shown embodiment, the second surface 112 of the ceramic resistor 1 can be disposed on the substrate unit 21 in the step S130, the metal layer 23" can be etched and coated to form the first conductive layer 26 and the metal layer 23' can be etched and coated to form the second conductive layer 27. In other words, the position of the first conductive layer 26 and the position of the second conductive layer 27 can be exchanged.

It should be noted that the sequence of the steps S110~S150 in the instant embodiment can be changed, that is to say, the sequence of the steps S110~S150 in the instant disclosure is not limited to the above description. For example, the step S120 can be implemented before the step S110, or the two steps S110, S120 are implemented at the same time. Moreover, the circuit board structure 100 in the instant disclosure can be provided without the second connecting pads 14, the second resistance layers 15, and the second conductive layer 27.

The instant embodiment also provides a circuit board structure 100 (as shown in FIG. 8) produced by implementing the above steps S110~S150, and the following description briefly discloses the circuit board structure 100 shown in FIG. 8. Moreover, part of the features of the circuit board structure 100 have been disclosed in the above description, so the following description omits that part of the features.

The circuit board structure 100 includes a multi-layer board 2 and a ceramic resistor 1 embedded in the multi-layer board 2. The ceramic resistor 1 is preferably arranged at the center of the multi-layer board 2, that is to say, a distance between an outer surface of the multi-layer board 2 and the ceramic resistor 1 is equal to a distance between an opposite outer surface of the multi-layer board 2 and the ceramic resistor 1. Thus, the position of the ceramic resistor 1 with respect to the multi-layer board 2 can avoid a breaking problem when the circuit board structure 100 expands with heat and contracts with cold.

The ceramic resistor 1 includes a ceramic sheet 11, a plurality of first connecting pads 12, a plurality of first resistance layers 13, a plurality of second connecting pads 14, and a plurality of second resistance layers 15. The ceramic sheet 11 has a first surface 111 and an opposite second surface 112, and a distance between the first surface 111 and the second surface 112 in the instant embodiment is less than or equal to 1 mm.

The first connecting pads 12 are spacedly formed on the first surface 111 of the ceramic sheet 11, the first resistance layers 13 are formed on the first surface 111 of the ceramic sheet 11, and each of the first resistance layers 13 connects at least two of the first connecting pads 12. The second connecting pads 14 are spacedly formed on the second surface 112 of the ceramic sheet 11, the second resistance layers 15 are formed on the second surface 112 of the ceramic sheet 11, and each of the second resistance layers 15 connects at least two of the second connecting pads 14.

Specifically, each of the first resistance layers 13 includes a main portion 131 and at least two covering portions 132 integrally extended from the main portion 111. Each main portion 131 is formed on the first surface 111, and the at least two covering portions 132 of each first resistance layer 13 respectively covers a portion of the connected first connecting pads 12.

Moreover, any two of the first connecting pads 12 are electrically connected to at least one of the first resistance layers 13 to provide a resistance value. Thus, the ceramic resistor 1 can provide a plurality of resistance values by using the first connecting pads 12 and the first resistance layers 13, and the number of the resistance values is more the number of the first resistance layers 13. Any two of the second connecting pads 14 are electrically connected to at least one of the second resistance layers 15 to provide a resistance value.

The multi-layer board 2 includes an insulating material 25, a substrate unit 21 and a second conductive layer 27 respectively formed on two opposite surfaces of the insulating material 25, and a buffering layer 24 arranged between the insulating material 25 and the substrate unit 21.

The substrate unit 21 includes an insulating layer 22, a metal layer 23, and a first conductive layer 26. The metal layer 23 and the first conductive layer 26 are respectively disposed on two opposite sides of the insulating layer 22. The metal layer 23 has a notch 211. The first connecting pads 12 and the first resistance layers 13 are at least partially arranged in the notch 211, and the buffering layer 24 is filled in the notch 211 to entirely cover the first connecting pads 12 and the first resistance layers 13. In addition, the buffering layer 24 in the instant embodiment protrudes from (the notch 211 of) the metal layer 23 and is formed on the first surface 111 of the ceramic sheet 11, but the instant disclosure is not limited thereto.

The first conductive layer 26 includes a plurality of first contacts 261 respectively and electrically connected to the first connecting pads 12, and the first contacts 261 are arranged apart from each other. The second conductive layer 27 includes a plurality of second contacts 271 respectively and electrically connected to the second connecting pads 14, and the second contacts 271 are arranged apart from each other. The first contacts 261 pass through the insulating layer 22 and the buffering layer 24 to respectively connect the first connecting pads 12, and the second contacts 271 pass through the insulating material 25 to respectively connect the second connecting pads 14.

Figure 9:
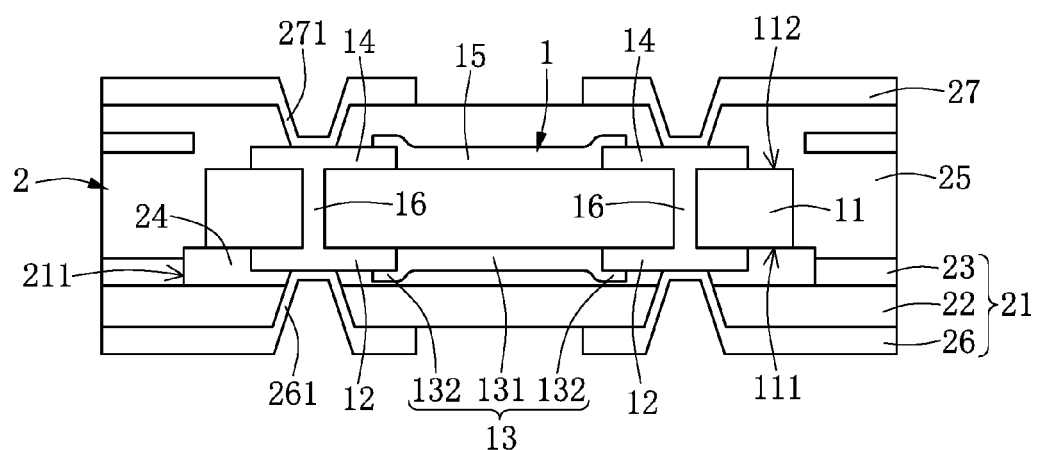
FIG. 9 is a cross-sectional view showing a variety of FIG. 8.

In addition, as shown in FIG. 9, the ceramic resistor 1 can further include at least one conductive pillar 16 embedded in the ceramic sheet 11, and two opposite ends of the at least one conductive pillar 16 are respectively connected to one of the first connecting pads 12 and one of the second connecting pads 14.

Moreover, the terms "first" and "second" in the instant embodiment are used to explain the elements of the circuit board structure 100, but the terms "first" and "second" do not indicate an order of function or structure. Thus, the terms "first" and "second" in the instant embodiment can also be omitted.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A circuit board structure, comprising:
a ceramic resistor including:
   a ceramic sheet having a first surface and an opposite second surface;
   a plurality of first connecting pads spacedly formed on the first surface of the ceramic sheet; and
   a plurality of first resistance layers formed on the first surface of the ceramic sheet, wherein each of the first resistance layers connects at least two of the first connecting pads, and any two of the first connecting pads are electrically connected to at least one of the first resistance layers to provide a resistance value, wherein the ceramic resistor is configured to provide a plurality of resistance values by using the first connecting pads and the first resistance layers, and the number of the resistance values is more the number of the first resistance layers; and
a multi-layer board having a first conductive layer, wherein the ceramic resistor is embedded in the multi-layer board, and the first conductive layer includes a plurality of first contacts respectively and electrically connected to the first connecting pads, and the first contacts are arranged apart from each other.

2. The circuit board structure as claimed in claim 1, wherein a distance between the first surface and the second surface is less than or equal to 1 mm, and a distance between an outer surface of the multi-layer board and the ceramic resistor is equal to a distance between an opposite outer surface of the multi-layer board and the ceramic resistor.

3. The circuit board structure as claimed in claim 1, wherein the ceramic resistor includes a plurality of second connecting pads and a plurality of second resistance layers, the second connecting pads are spacedly formed on the second surface of the ceramic sheet, the second resistance layers are formed on the second surface of the ceramic sheet, wherein each of the second resistance layers connects at least two of the second connecting pads, and any two of the second connecting pads are electrically connected to at least one of the second resistance layers to provide a resistance value, wherein the multi-layer board includes a second conductive layer, and the second conductive layer includes a plurality of second contacts respectively and electrically connected to the second connecting pads, and the second contacts are arranged apart from each other.

4. The circuit board structure as claimed in claim 3, wherein the ceramic resistor includes at least one conductive pillar embedded in the ceramic sheet, and two opposite ends of the at least one conductive pillar are respectively connected to one of the first connecting pads and one of the second connecting pads.

5. The circuit board structure as claimed in claim 1, wherein each of the first resistance layers includes a main portion and at least two covering portions integrally extended from the main portion and respectively covering a portion of the connected first connecting pads.

6. The circuit board structure as claimed in claim 1, wherein the multi-layer board includes a substrate unit and a buffering layer, the substrate unit includes an insulating layer, a metal layer, and the first conductive layer, wherein the metal layer and the first conductive layer are respectively formed on two opposite surface of the insulating layer, the metal layer has a notch, the first connecting pads and the first resistance layers are at least partially arranged in the notch, and the buffering layer is filled in the notch to cover the first connecting pads and the first resistance layers, wherein the first contacts pass through the insulating layer and the buffering layer to respectively connect the first connecting pads.

* * * * *